United States Patent
Abe et al.

(10) Patent No.: US 9,184,329 B2
(45) Date of Patent: Nov. 10, 2015

(54) PHOTOELECTRIC CONVERSION DEVICE

(75) Inventors: Shinichi Abe, Uji (JP); Akio Yamamoto, Higashiomi (JP); Seiji Oguri, Higashiomi (JP); Kazumasa Umesato, Shiga (JP)

(73) Assignee: KYOCERA Corporation, Kyoto (JP)

( * ) Notice: Subject to any disclaimer, the term of this patent is extended or adjusted under 35 U.S.C. 154(b) by 128 days.

(21) Appl. No.: 14/114,895

(22) PCT Filed: May 29, 2012

(86) PCT No.: PCT/JP2012/063788
§ 371 (c)(1),
(2), (4) Date: Oct. 30, 2013

(87) PCT Pub. No.: WO2012/176589
PCT Pub. Date: Dec. 27, 2012

(65) Prior Publication Data
US 2014/0069492 A1    Mar. 13, 2014

(30) Foreign Application Priority Data

Jun. 22, 2011   (JP) .................................. 2011-138427

(51) Int. Cl.
| | |
|---|---|
| H01L 31/065 | (2012.01) |
| H01L 31/032 | (2006.01) |
| H01L 31/0749 | (2012.01) |
| H01L 31/046 | (2014.01) |
| H01L 31/0465 | (2014.01) |

(52) U.S. Cl.
CPC .......... *H01L 31/065* (2013.01); *H01L 31/0322* (2013.01); *H01L 31/046* (2014.12); *H01L 31/0465* (2014.12); *H01L 31/0749* (2013.01); *Y02E 10/541* (2013.01)

(58) Field of Classification Search
CPC . H01L 31/00; H01L 31/0248; H01L 31/0256; H01L 31/0272; H01L 31/0322; H01L 31/0352; H01L 31/035272; H01L 31/04; H01L 31/0749; H01L 31/18; H01L 31/042
See application file for complete search history.

(56) References Cited

U.S. PATENT DOCUMENTS

| | | | | |
|---|---|---|---|---|
| 5,286,306 A | * | 2/1994 | Menezes | ........................ 136/249 |
| 2012/0180870 A1 | * | 7/2012 | Yamamoto | .................... 136/262 |

FOREIGN PATENT DOCUMENTS

JP    H10-135498 A    5/1998

OTHER PUBLICATIONS

International Search Report dated Jun. 26, 2012, issued for International Application No. PCT/JP2012/063788.

* cited by examiner

*Primary Examiner* — Christina Chern
(74) *Attorney, Agent, or Firm* — Procopio, Cory, Hargreave & Savitch, LLP

(57) ABSTRACT

A photoelectric conversion device is disclosed. The photoelectric conversion device includes an electrode layer and a semiconductor layer. The semiconductor layer is located on the electrode layer and contains a group I-III-VI compound. In the semiconductor layer, an atomic ratio of a group I-B element to a group III-B element decreases from one principal surface side of the semiconductor layer on the electrode layer side to a central portion in a thickness direction and increases from the central portion to another principal surface side on a side opposite to the electrode layer.

9 Claims, 6 Drawing Sheets

US 9,184,329 B2

PHOTOELECTRIC CONVERSION DEVICE

TECHNICAL FIELD

The present invention relates to a photoelectric conversion device having a semiconductor layer containing a group I-III-VI compound.

BACKGROUND ART

As a photoelectric conversion device to be used in a photovoltaic power generation system or the like, those in which a semiconductor layer is formed with a chalcopyrite-based group I-III-VI compound, such as CIS and CIGS, have been provided. Such a photoelectric conversion device is disclosed in Japanese Unexamined Patent Application Publication No. 10-135498 (hereinafter referred to as Patent Literature 1), for example.

The photoelectric conversion device containing a group I-III-VI compound has a configuration in which a plurality of photoelectric conversion cells are two-dimensionally arranged side by side. Each photoelectric conversion cell includes a lower electrode such as a metal electrode, a semiconductor layer containing a group I-III-VI compound as a light absorption layer, a buffer layer, and an upper electrode such as a transparent electrode or a metal electrode, which are stacked in this order on a glass substrate or the like. The plurality of photoelectric conversion cells are electrically connected in series by electrically connecting the upper electrode of one of adjacent photoelectric conversion cells and the lower electrode of the other of the adjacent photoelectric conversion cells by a connection conductor.

SUMMARY OF INVENTION

Improvement of photoelectric conversion efficiency in a photoelectric conversion device has been desired. The photoelectric conversion efficiency indicates a ratio of conversion from sunlight energy to electric energy in the photoelectric conversion device and is derived by, for example, dividing a value of the electric energy output from the photoelectric conversion device by a value of the energy of the sunlight entering the photoelectric conversion device, and then multiplying the result by 100. Then, it is an object of the present invention to improve the photoelectric conversion efficiency in the photoelectric conversion device.

The photoelectric conversion device according to one embodiment of the present invention includes an electrode layer and a semiconductor layer containing a group I-III-VI compound located on the electrode layer, in which, in the semiconductor layer, the atomic ratio of a group I-B element to a group III-B element decreases from one principal surface side of the semiconductor layer on the electrode layer side to the central portion in the thickness direction and increases from the central portion to the other principal surface side on the side opposite to the electrode layer.

According to the above-described embodiment of the present invention, the conversion efficiency in the photoelectric conversion device improves.

DESCRIPTION OF EMBODIMENTS

Hereinafter, a photoelectric conversion device according to one embodiment of the present invention is described in detail with reference to the drawings.

Figure 1:
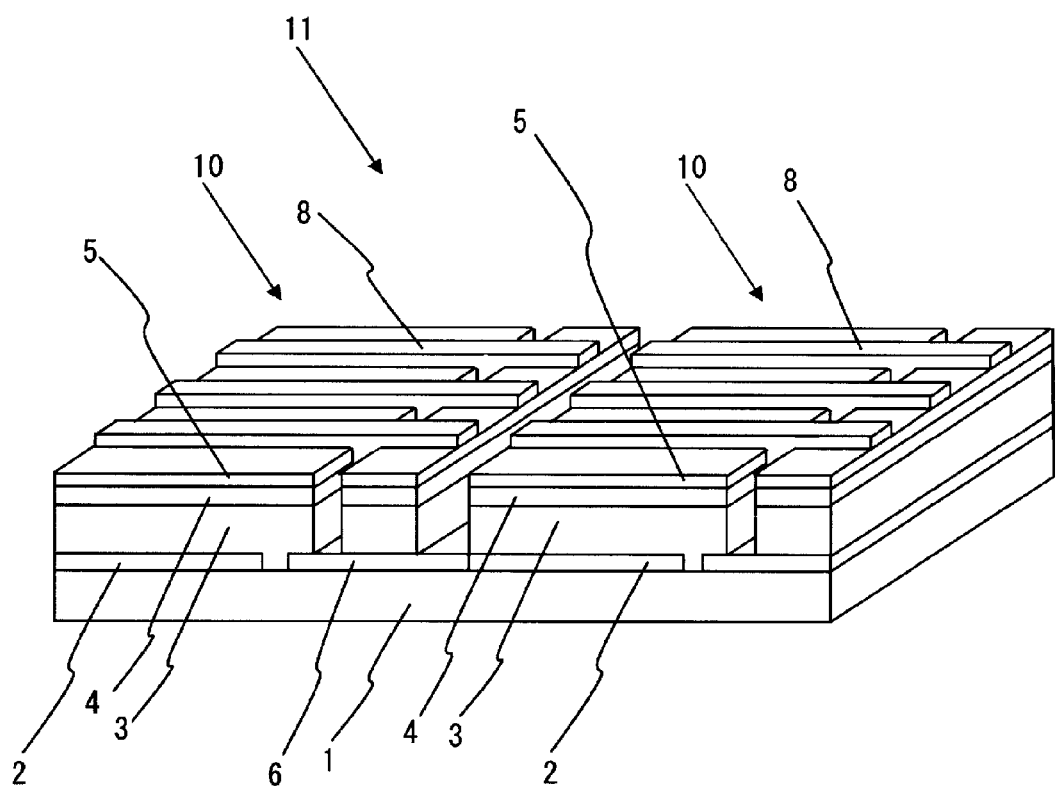
FIG. 1 is a perspective view illustrating an example of an embodiment of a photoelectric conversion device.
Figure 2:
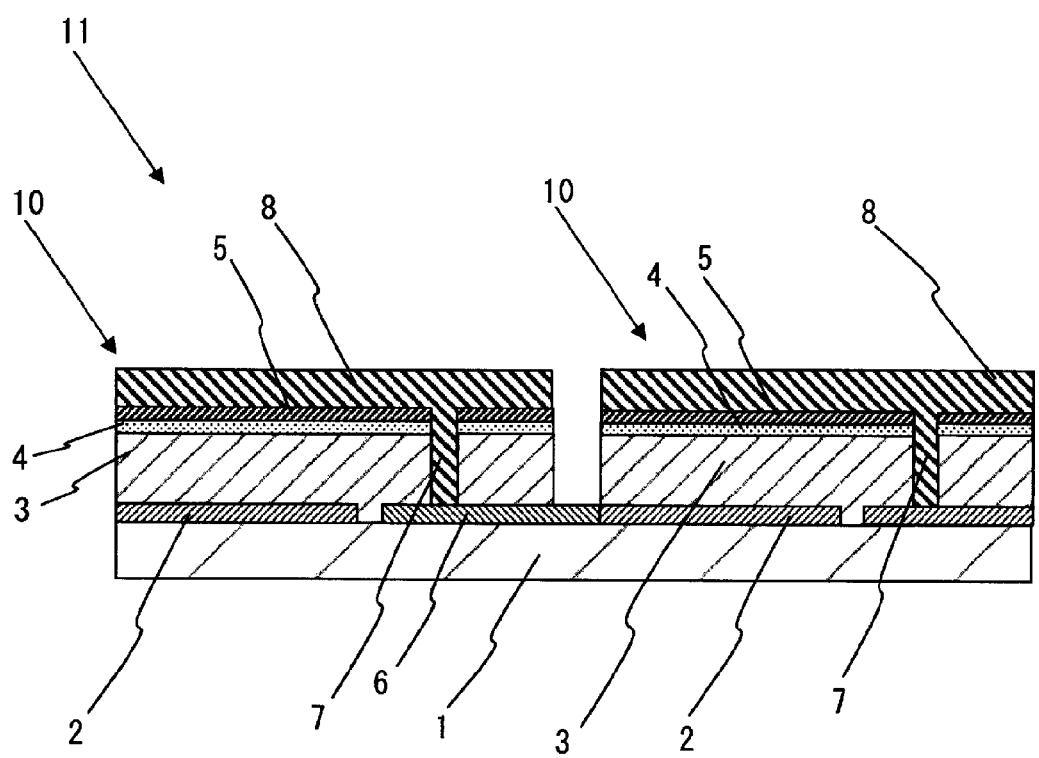
FIG. 2 is a cross sectional view of the photoelectric conversion device of FIG. 1.

FIG. 1 is a perspective view illustrating an example of the photoelectric conversion device according to one embodiment of the present invention. FIG. 2 is a cross sectional view thereof. A photoelectric conversion device 11 includes a substrate 1, a first electrode layer 2, a first semiconductor layer 3 that is a semiconductor layer containing a group I-III-VI compound, a second semiconductor layer 4, and a second electrode layer 5.

The first semiconductor layer 3 and the second semiconductor layer 4 are different in the conductivity type and are electrically connected to each other. Thus, a photoelectric conversion body from which charges can be extracted well is formed. For example, when the first semiconductor layer 3 is a p-type layer, the second semiconductor layer 4 is an n-type layer. Between the first semiconductor layer 3 and the second semiconductor layer 4, a buffer layer with high resistance may be provided. This embodiment describes an example in which the first semiconductor layer 3 is one conductivity-type light absorption layer and the second semiconductor layer 4 functions as a buffer layer and the other conductivity-type semiconductor layer.

As the photoelectric conversion device 11 in this embodiment, one in which light enters from the second electrode layer 5 side is assumed. However, the photoelectric conversion device 11 in this embodiment is not limited thereto and may be one in which light enters from the substrate 1 side.

In FIG. 1 and FIG. 2, a plurality of photoelectric conversion cells 10 are arranged, are electrically connected to each other, and constitute the photoelectric conversion device 11. The photoelectric conversion cells 10 each include a third electrode layer 6 separated from the first electrode layer 2 on the substrate 1 side of the first semiconductor layer 3. The second electrode layer 5 and the third electrode layer 6 are electrically connected via a connection conductor 7 in the first semiconductor layer 3. In FIG. 1 and FIG. 2, the third electrode layer 6 is a layer obtained by extending the first electrode layer 2 of the adjacent photoelectric conversion cell 10. With this configuration, the adjacent photoelectric conversion cells 10 are connected in series. In one photoelectric conversion cell 10, the connection conductor 7 penetrates the first semiconductor layer 3 and the second semiconductor layer 4, and photoelectric conversion is performed in the first semiconductor layer 3 and the second semiconductor layer 4 held between the first electrode layer 2 and the second electrode layer 5.

The substrate 1 supports the photoelectric conversion cells 10. As materials for use in the substrate 1, glass, ceramics, resin, metal, and the like are mentioned, for example.

For the first electrode layer 2 and the third electrode layer 6, an electric conductor such as Mo, Al, Ti, or Au is used. The first electrode layer 2 and the third electrode layer 6 are formed on the substrate 1 by sputtering, vapor deposition, or the like.

The first semiconductor layer 3 contains a group I-III-VI compound. The group I-III-VI compound is a compound of a group I-B element (also referred to as a group 11 element), a group III-B element (also referred to as a group 13 element), and a group VI-B element (also referred to as a 16 group element), has a chalcopyrite structure, and is referred to as a chalcopyrite-based compound (also referred to as a CIS-based compound). As the group I-III-VI compound, Cu(In,Ga)Se$_2$ (also referred to as CIGS), Cu(In, Ga)(Se, S)$_2$ (also referred to as CIGSS), and CuInSe$_2$ (also referred to as CIS) are mentioned, for example. Cu(In, Ga)Se$_2$ refers to a compound mainly containing Cu, In, Ga, and Se. Cu(In, Ga)(Se, S)$_2$ refers to a compound mainly containing Cu, In, Ga, Se, and S. Such group I-III-VI compounds have high photoelectric conversion efficiency and even when the group I-III-VI compounds are used as a thin layer of 10 μm or less, effective electromotive force can be obtained.

Figure 3:
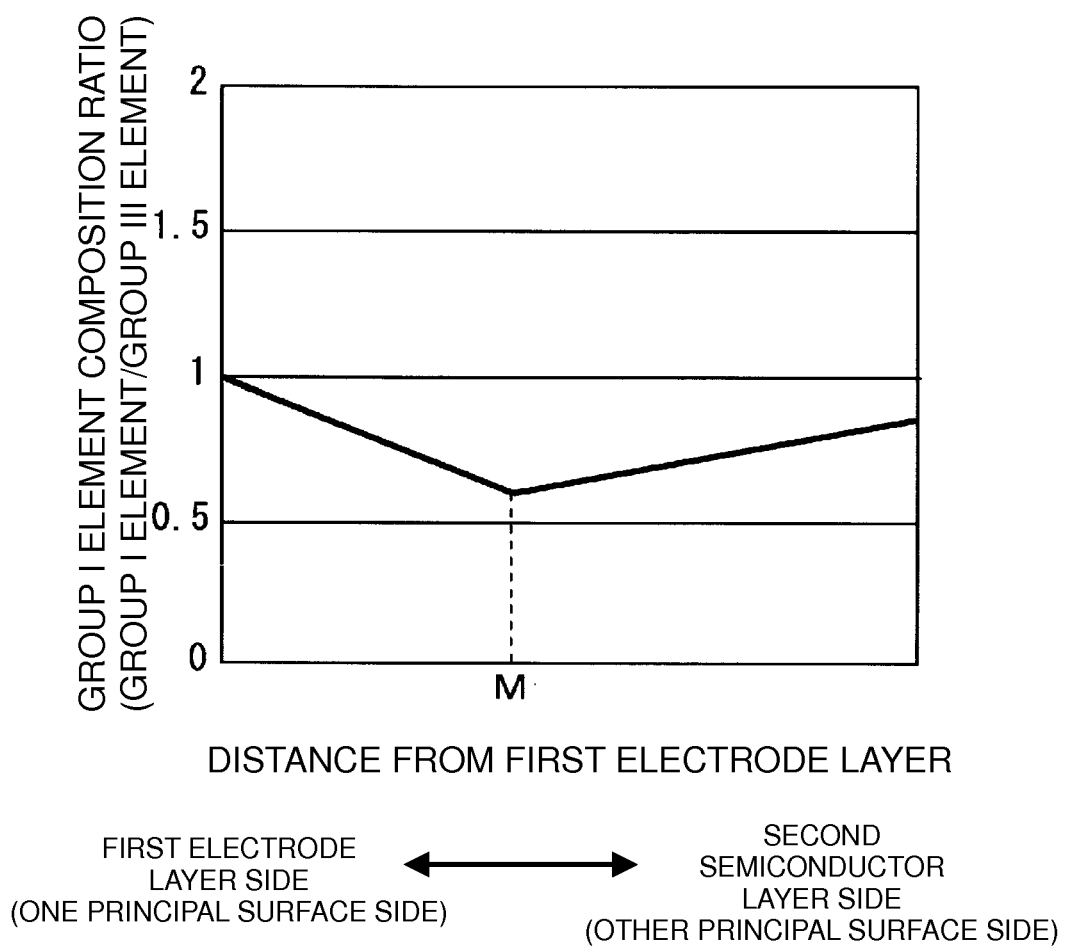
FIG. 3 is a graph showing the composition ratio of a first semiconductor layer.

In the first semiconductor layer 3, the atomic ratio of the group I-B element (total number thereof when there are a plurality of kinds of the group I-B elements) to the group III-B element (total number thereof when there are a plurality of kinds of group III-B elements) (hereinafter the atomic ratio of the group I-B element to the group III-B element is referred to as an atomic ratio C) decreases from one principal surface side of the first semiconductor layer 3 on the electrode layer 2 side to a central portion M in the thickness direction and increases from the central portion M to the other principal surface side on the second electrode layer 4 side. More specifically, the atomic ratio C reaches a relative minimum value at the central portion M. FIG. 3 is a graph showing an example of the composition distribution in the thickness direction of the first semiconductor layer 3. In the graph of FIG. 3, the horizontal axis represents the distance in the first semiconductor layer 3 from the first electrode layer 2 and the vertical axis represents the atomic ratio C in the first semiconductor layer 3.

With such a configuration, the energy level of the valence band of the first semiconductor layer 3 can be well inclined in the first semiconductor layer 3 in the vicinity of the first electrode layer 2. More specifically, the energy level of the valence band can be high as the valence band of the first semiconductor layer 3 is closer to the first electrode layer 2 and holes generated by photoelectric conversion easily move to the first electrode layer 2. In the vicinity of the second semiconductor layer 4 in the first semiconductor layer 3, the degree of crystallinity of the first semiconductor layer 3 can be increased due to the ratio of the group I-B element being high. Therefore, electrical connection with the second semiconductor layer 4 becomes good. As a result, recombination of electrons and holes generated by photoelectric conversion decreases, and the photoelectric conversion efficiency of the photoelectric conversion device 11 becomes high.

The central portion M is not limited to the ½ portion (portion at the midpoint between one principal surface and the other principal surface) in the thickness of the first semiconductor layer 3 and may be located at a portion between both the principal surfaces of the first semiconductor layer 3 (between one principal surface and the other principal surface). From the viewpoint of reducing variations in crystallinity in the thickness direction of the first semiconductor layer 3, when the thickness of the first semiconductor layer 3 is set to L, the distance from the first electrode layer 2 to the central portion M may be in the range of 0.3 L or more and 0.7 L or less.

From the viewpoint of increasing both the crystallinity of the first semiconductor layer 3 and the mobility of charges generated by photoelectric conversion, when the atomic ratio C at a portion where the atomic ratio C reaches the maximum in a region from the central portion M in the first semiconductor layer 3 to the first electrode layer 2 is set to X and the atomic ratio C at the central portion M is set to Y, $0.1 \le X-Y \le 0.5$ may be established. When the atomic ratio C at a portion where the atomic ratio C reaches the maximum in a region from the central portion M in the first semiconductor layer 3 to the second semiconductor layer 4 is set to Z, $0.05 \le Z-Y \le 0.2$ may be established.

From the viewpoint of further increasing the mobility of holes to the first electrode layer 2 side in the first semiconductor layer 3, the atomic ratio C may reach the maximum on one principal surface side of the first semiconductor layer 3 on the first electrode layer 2 side. In such a configuration, the inclination of the energy level of the valence band in the vicinity of the first electrode layer 2 side in the first semiconductor layer 3 becomes steeper, and the movement of holes to the first electrode layer 2 is further accelerated.

From the viewpoint of reducing strain in the first semiconductor layer 3, the central portion M may be located closer to the first electrode layer 2 rather than the midpoint (½ portion in the thickness of the first semiconductor layer 3) between one principal surface and the other principal surface of the first semiconductor layer 3. More specifically, the portion where the atomic ratio C reaches the relative minimum value may be located closer to the first electrode layer 2. With such a configuration, the increasing rate of the group I-B element which increases from the central portion M to the second semiconductor layer 4 becomes low, and strain due to differences in crystallinity can be reduced. As a result, defects caused by the strain are reduced and recombination of electrons and holes is further reduced, and further the inclination of the energy level of the valence band becomes steeper from the central portion M to the first electrode layer 2 and the mobility of holes to the first electrode layer 2 also becomes higher.

From the viewpoint of reducing the formation of a heterophase of a group I-VI compound having metallic properties and further increasing the photoelectric conversion efficiency, the atomic ratio C may be smaller than 1 over the entire region in the thickness direction of the first semiconductor layer 3.

Furthermore, from the viewpoint of extending the absorption wavelength region, the first semiconductor layer 3 may contain In and Ga as the group III-B element and the atomic ratio of Ga to the total of In and Ga may decrease from the principal surface on the first electrode layer 2 side to the central portion M. With such a configuration, the band gap of the first semiconductor layer 3 greatly changes in the thickness direction due to changes in the energy level of the conduction band due to changes in the atomic ratio of Ga and changes in the energy level of the valence band due to changes in the atomic ratio of the group I-B element, and thus the absorption wavelength region extends and the photoelectric conversion efficiency of the photoelectric conversion device 11 is further increased.

Such a first semiconductor layer 3 can be produced by the following method, for example. First, a coating film containing a group I-B element and a group III-B element is produced by applying a raw material solution or by a thin film forming method, such as sputtering. In the formation of the coating film, a plurality of coating films are stacked while changing the ratio of the group I-B element to the group III-B element. Then, by heating the coating films in an atmosphere containing a chalcogen element, the first semiconductor layer 3 containing the group I-III-VI compound in which the atomic ratio C of the group I-B element to the group III-B element changes in the thickness direction can be formed.

In the photoelectric conversion device 11, the second semiconductor layer 4 whose conductivity type is different from that of the first semiconductor layer 3 is formed on the first semiconductor layer 3. The first semiconductor layer 3 and the second semiconductor layer 4 have different conductivity types in which one layer is a p-type layer and the other layer is an n-type layer, and form a pn junction. Or, the first semiconductor layer 3 may be a p-type layer and the second semiconductor layer 4 may be an n-type layer, or vice versa. The pn junction formed by the first semiconductor layer 3 and the second semiconductor layer 4 is not limited to direct junction of the first semiconductor layer 3 and the second semiconductor layer 4. For example, another semiconductor layer having the same conductivity type as that of the first semiconductor layer 3 or another semiconductor layer having the same conductivity type as that of the second semiconductor layer 4 may be provided therebetween. A pin junction having an i-type semiconductor layer may be formed between the first semiconductor layer 3 and the second semiconductor layer 4.

As the second semiconductor layer 4, CdS, ZnS, ZnO, $In_2Se_3$, In(OH, S), (Zn, In) (Se, OH), (Zn, Mg)O, and the like are mentioned. In this case, the second semiconductor layer 4 is formed with a thickness of 10 to 200 nm by chemical bath deposition (CBD) or the like, for example. In(OH, S) refers to a compound mainly containing In, OH, and S. (Zn, In)(Se, OH) refers to a compound mainly containing Zn, In, Se, and OH. (Zn, Mg)O refers to a compound mainly containing Zn, Mg, and O.

The second electrode layer 5 is a transparent conductive film, such as ITO and ZnO, having a thickness of 0.05 to 3 μm. In order to increase the translucency and the conductivity, the second electrode layer 5 may be constituted by a semiconductor whose conductivity type is the same as that of the second semiconductor layer 4. The second electrode layer 5 is formed by sputtering, vapor deposition, chemical vapor deposition (CVD), or the like. The second electrode layer 5 is a layer whose resistivity is lower than that of the second semiconductor layer 4 and is one for extracting charges generated in the first semiconductor layer 3. From the viewpoint of extracting charges well, the resistivity of the second electrode layer 5 may be 1 Ω·cm or less and the sheet resistance may be 50Ω/□ or less.

The second electrode layer 5 may have light transmission properties to the absorption light of the first semiconductor layer 3 in order to increase the absorption efficiency of the first semiconductor layer 3. From the viewpoint of increasing the light transmission properties and well transmitting current generated by photoelectric conversion, the thickness of the second electrode layer 5 may be 0.05 to 0.5 μm. From the viewpoint of reducing light reflection on the interface of the second electrode layer 5 and the second semiconductor layer 4, difference between refractive indices of the second electrode layer 5 and the second semiconductor layer 4 may be small.

A plurality of the photoelectric conversion cells 10 are arranged and are electrically connected to constitute the photoelectric conversion device 11. In order to easily connect the adjacent photoelectric conversion cells 10 in series, the photoelectric conversion cells 10 each have the third electrode layer 6 provided separately from the first electrode layer 2 on the substrate 1 side of the first semiconductor layer 3 as illustrated in FIG. 1. The second electrode layer 5 and the third electrode layer 6 are electrically connected by the connection conductor 7 in the first semiconductor layer 3.

In FIG. 2, the connection conductor 7 is formed by filling a groove penetrating the first semiconductor layer 3, the second semiconductor layer 4, and the second electrode layer 5 with a conductor, such as a conductive paste. The connection conductor 7 is not limited thereto and may be formed by extending the second electrode layer 5.

As illustrated in FIG. 1 and FIG. 2, a collector electrode 8 may be formed on the second electrode layer 5. The collector electrode 8 is provided for reducing the electrical resistance of the second electrode layer 5. For example, as illustrated in FIG. 1, the collector electrode 8 is formed in the shape of a line from one end of the photoelectric conversion cell 10 to the connection conductor 7. Thus, current generated by photoelectric conversion in the first semiconductor layer 3 is collected to the collector electrode 8 through the second electrode layer 5, and is well conducted to the photoelectric conversion cells 10 adjacent thereto through the connection conductor 7. Therefore, due to the fact that the collector electrode 8 is provided, even when the thickness of the second electrode layer 5 is reduced in order to increase the light transmittance to the first semiconductor layer 3, the current generated in the first semiconductor layer 3 can be efficiently extracted. As a result, the photoelectric conversion efficiency can be increased.

The collector electrode 8 may have a width of 50 to 400 μm from the viewpoint of increasing the light transmittance to the first semiconductor layer 3 and having good conductivity. The collector electrode 8 may also have a plurality of branched portions which are branched.

For example, the collector electrode 8 is formed by printing a metal paste in which metal powder, such as Ag, is dispersed in a resin binder or the like into a pattern, and then curing the same.

The present invention is not limited to the above-described embodiments and may be variously modified without deviating from the gist of the present invention.

EXAMPLES

Next, the relationship between the distribution of the atomic ratio C and the photoelectric conversion efficiency is described with reference to specific examples.

Herein, a raw material solution for producing a first semiconductor layer was produced by successively performing the following processes [a] to [d].

Process [a]: 10 mmol of $Cu(CH_3CN)_4.PF_6$ which is an organic metal complex of a group I-B element and 20 mmol of $P(C_6H_5)_3$ which is a Lewis basic organic compound were dissolved in 100 ml of acetonitrile, and then stirred at room temperature (for example, about 25° C.) for 5 hours, thereby preparing a first complex solution.

Process [b]: 40 mmol of sodium methoxide ($CH_3ONa$) which is metal alkoxide and 40 mmol of $HSeC_6H_5$ which is a chalcogen element containing organic compound were dissolved in 300 ml of methanol, 6 mmol of $InCl_3$ and 4 mmol of $GaCl_3$ were dissolved, and then the solution was stirred at room temperature for 5 hours, thereby preparing a second complex solution.

Process [c]: The second complex solution prepared in the process [b] was added dropwise at a speed of 10 ml per minute to the first complex solution prepared in the process [a], thereby producing a white deposition (precipitate). After the completion of the dropwise addition, stirring at room temperature for 1 hour and extraction of the precipitate by a centrifuge were successively performed. In the extraction of this precipitate, a process of dispersing the precipitate extracted once by a centrifuge in 500 ml of methanol and then extracting the precipitate again by the centrifuge was repeated twice, and finally the precipitate was dried at room temperature, thereby obtaining complex compounds shown by the following structural formula (1) and structural formula (2) in the form of a mixture. Ph in the structural formula (1) and the structural formula (2) is a phenyl group.

[Chemical Formula 1]

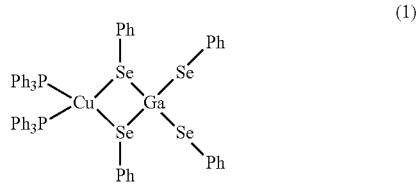

(1)

[Chemical Formula 2]

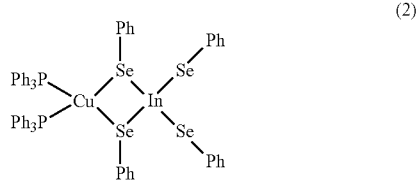

(2)

Process [d]: By adding pyridine which is an organic solvent to the complex compounds obtained in the process [c], a solution in which the concentration of the complex compounds is 45% by mass was prepared. Thereafter, powder of copper selenide (CuSe) was added to this solution with various amounts, and then the powder was dissolved in the solution by stirring at 80° C. for 60 minutes, thereby producing a plurality of raw material solutions different in the atomic ratio of Cu to a group III-B element (In and Ga).

Next, a substrate formed with glass on which a first electrode layer containing Mo or the like was formed on the surface thereof was prepared, the raw material solution was applied onto the first electrode layer by blading, and then the solution was dried by holding at 100° C. for 15 minutes, thereby forming a coating film. The formation of the coating film was successively repeated using the raw material solutions different in the atomic ratio of Cu, thereby forming a layered structure of three coating films. Then, the layered structure was heat-treated under an atmosphere of mixed gas of hydrogen gas and selenium steam gas. In the heat treatment, the temperature was increased in 5 minutes from around room temperature to 400° C., the layered structure was held at 400° C. for 2 hours, and then naturally cooled, thereby forming a semiconductor layer for evaluation equivalent to a first semiconductor layer containing CIGS. As the semiconductor layer for evaluation, three kinds of semiconductor layers for evaluation different in the distribution of the atomic ratio C in the thickness direction were prepared.

Furthermore, each substrate in which the processes to the formation of the semiconductor layer for evaluation were completed was immersed in a solution in which zinc acetate and thiourea were dissolved in ammonia water, thereby forming on the first semiconductor layer a 50-nm thick second semiconductor layer containing ZnS. Then, on the second semiconductor layer, a second electrode layer containing ZnO doped with Al was formed by sputtering, thereby producing a photoelectric conversion device for evaluation.

In the cross section of the first semiconductor layer of each photoelectric conversion device for evaluation thus produced, the composition analysis in the thickness direction of the first semiconductor layer was performed using X-ray photoelectron spectroscopy (XPS).

Figure 4:
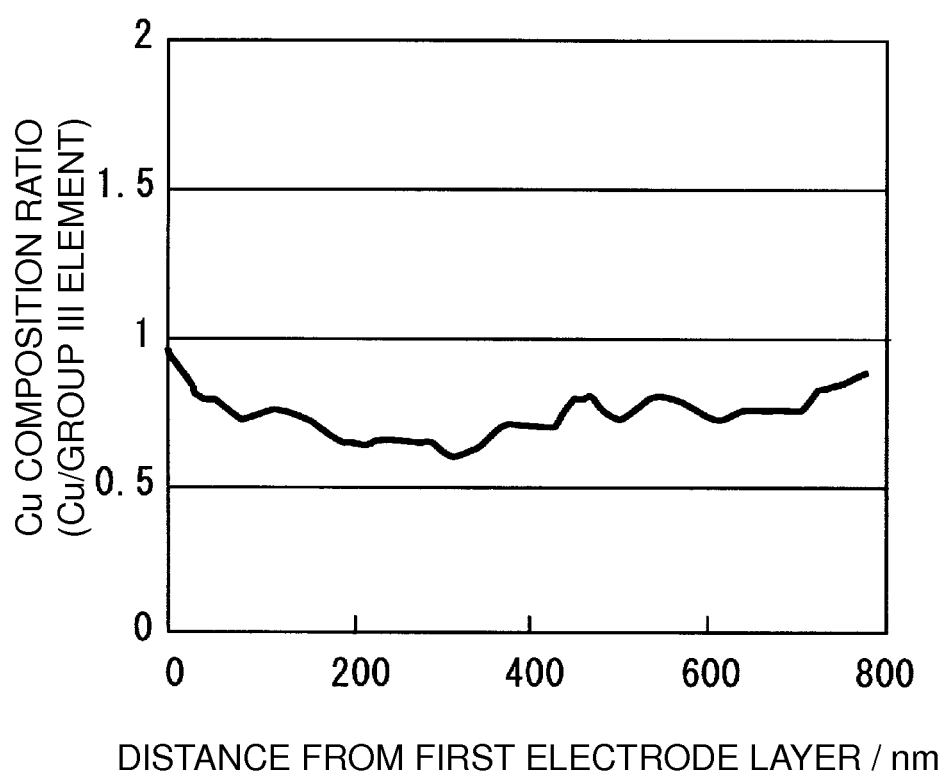
FIG. 4 is a graph showing the composition ratio of a first semiconductor layer in a photoelectric conversion device for evaluation.
Figure 5:
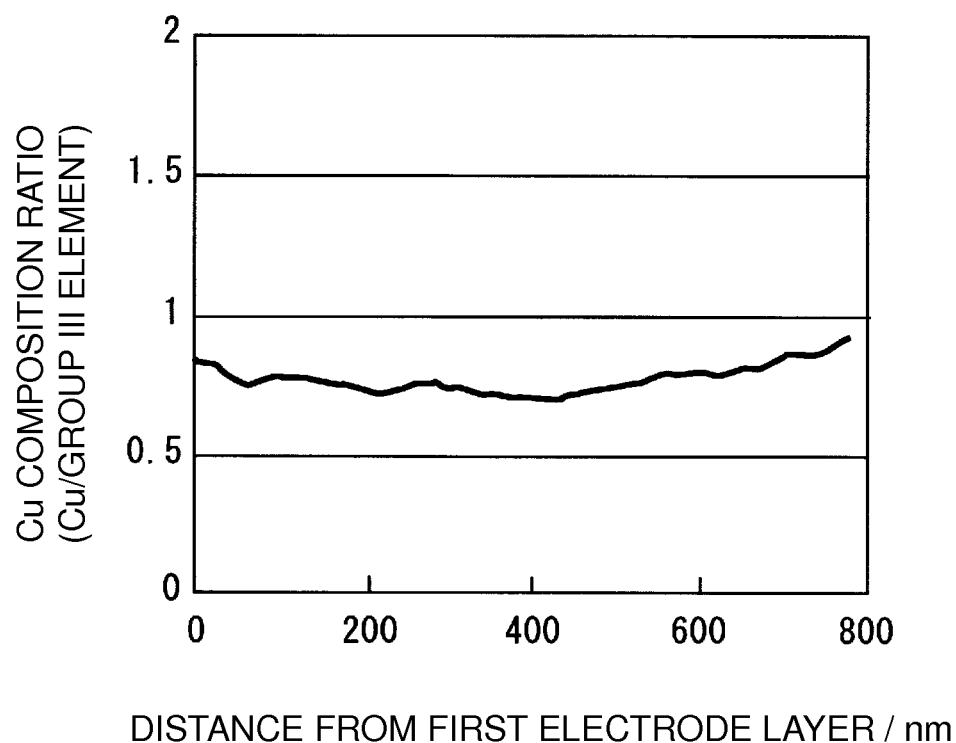
FIG. 5 is a graph showing the composition ratio of a first semiconductor layer in a photoelectric conversion device for evaluation.
Figure 6:
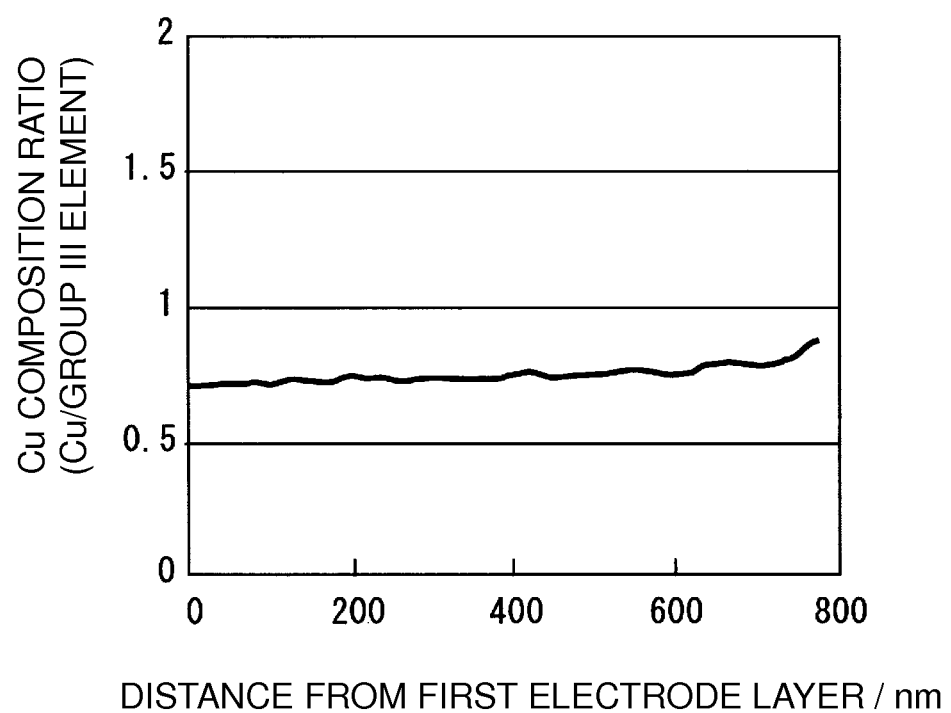
FIG. 6 is a graph showing the composition ratio of a first semiconductor layer in a photoelectric conversion device for evaluation.

FIG. 4 to FIG. 6 are graphs showing the analysis results of respective semiconductor layers for evaluation. In FIG. 4, the atomic ratio C of Cu to the group III-B element of the first semiconductor layer reaches the maximum value on the interface (0 nm portion from the first electrode layer) with the first electrode layer. Then, the atomic ratio C decreases from the interface to the central portion in the thickness direction of the first semiconductor layer, and reaches the relative minimum value at a 310-nm portion from the first electrode layer. Then, the atomic ratio C increases from the relative minimum value to the second semiconductor layer. In FIG. 5, the atomic ratio C of the first semiconductor layer decreases from the interface (0 nm portion from the first electrode layer) with the first electrode layer to the central portion in the thickness direction of the first semiconductor layer, and reaches the relative minimum value at a 400 nm portion from the first electrode layer. The inclination of the atomic ratio C in the region where the distance from the first electrode layer is 0 to 400 nm is gentle as compared with FIG. 4. Then, the atomic ratio C increases from the relative minimum value toward the second semiconductor layer. In FIG. 6, the atomic ratio C gently increases as the distance from the first electrode layer increases, and does not show the relative minimum value. The photoelectric conversion device of FIG. 6 was used as a comparative example.

Next, regarding each of the photoelectric conversion devices for evaluation, photoelectric conversion efficiency was measured. As the photoelectric conversion efficiency in the photoelectric conversion devices, the photoelectric conversion efficiency was measured using a steady state solar simulator under the conditions where the light emission intensity to a light receiving surface of the photoelectric conversion devices was 100 mW/cm$^2$ and the AM (air mass) was 1.5.

As a result, the photoelectric conversion efficiency of the photoelectric conversion device having the composition distribution shown in FIG. 4 was 13.2%. The photoelectric conversion efficiency of the photoelectric conversion device having the composition distribution shown in FIG. 5 was 11.1%. On the other hand, the photoelectric conversion efficiency of the photoelectric conversion device as a comparative example having the composition distribution shown in FIG. 6 was 9.4%. From the description above, as shown in FIG. 4 and FIG. 5, it was found that, by providing the first semiconductor layer in which the atomic ratio C of the group I-B element to the group III-B element decreases from one principal surface side of the first semiconductor layer on the first electrode layer side to the central portion in the thickness direction and increases from the central portion to the other principal surface side on the second semiconductor layer side, the photoelectric conversion efficiency of the photoelectric conversion device increases to 10% or more. In particular, it was found that when the atomic ratio C reaches the maximum value on one principal surface side of the first semiconductor layer, the photoelectric conversion efficiency further increases.

REFERENCE SIGNS LIST

1: SUBSTRATE
2: FIRST ELECTRODE LAYER
3: FIRST SEMICONDUCTOR LAYER
4: SECOND SEMICONDUCTOR LAYER
5: SECOND ELECTRODE LAYER

10: PHOTOELECTRIC CONVERSION CELL
11: PHOTOELECTRIC CONVERSION DEVICE

The invention claimed is:

1. A photoelectric conversion device, comprising:
an electrode layer; and
a semiconductor layer containing a group I-III-VI compound, and located on the electrode layer,
wherein, in the semiconductor layer, an atomic ratio of a group I-B element to a group III-B element decreases from one principal surface side of the semiconductor layer on the electrode layer side to a central portion in a thickness direction and increases from the central portion to another principal surface side on a side opposite to the electrode layer,
wherein the atomic ratio is smaller than 1 over an entire region in the thickness direction of the semiconductor layer.

2. The photoelectric conversion device according to claim 1, wherein the atomic ratio reaches a maximum on the one principal surface side.

3. The photoelectric conversion device according to claim 1, wherein the central portion is located closer to the electrode layer rather than a midpoint between the one principal surface and the other principal surface.

4. The photoelectric conversion device according to claim 1, wherein the group I-III-VI compound is CIGS.

5. The photoelectric conversion device according to claim 4, wherein, in the semiconductor layer, an atomic ratio of a gallium element to a total of an indium element and a gallium element decreases from the one principal surface side of the semiconductor layer to the central portion thereof.

6. A photoelectric conversion device, comprising:
a substrate;
an electrode layer on the substrate; and
a semiconductor layer on the electrode layer:
    containing a compound semiconductor consisting of a group I-B element, one or more group III-B elements and one or more group VI-B elements:
    comprising first and second surfaces opposite to each other, the first surface closer to the electrode layer than the second surface; and
    having an atomic ratio of the group I-B elements to the one or more group III-B elements therein, the atomic ratio comprising a first atomic ratio at the first surface, a second atomic ratio at the second surface and a third atomic ratio at a center of the semiconductor layer in a thickness direction, wherein the third atomic ratio is smaller than the first and second atomic ratios,
wherein the atomic ratio is smaller than 1 over an entire region in the thickness direction of the semiconductor layer.

7. The photoelectric conversion device according to claim 6, wherein
the first atomic ratio is larger than the second atomic ratio.

8. The photoelectric conversion device according to claim 6, wherein
the atomic ratio further comprises a fourth atomic ratio at a location between the first surface and the center, and
the fourth atomic ratio is lower than the third atomic ratio.

9. A photoelectric conversion device, comprising:
a substrate;
an electrode layer on the substrate; and
a semiconductor layer on the electrode layer, containing a compound semiconductor consisting of a first element in group I-B, one or more second elements in group III-B and one or more third elements in group VI-B,
wherein an atomic ratio of the first element to the one or more second elements varies in a thickness direction on a cross-section of the semiconductor layer and has a lowest value at or near a midpoint of the semiconductor layer,
wherein the atomic ratio is smaller than 1 over an entire region in the thickness direction of the semiconductor layer.

* * * * *